United States Patent
Castle et al.

(10) Patent No.: US 6,947,805 B1
(45) Date of Patent: Sep. 20, 2005

(54) DYNAMIC METROLOGY SAMPLING TECHNIQUES FOR IDENTIFIED LOTS, AND SYSTEM FOR PERFORMING SAME

(75) Inventors: Howard E. Castle, Austin, TX (US); Naomi M. Jenkins, Round Rock, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 162 days.

(21) Appl. No.: 10/634,038

(22) Filed: Aug. 4, 2003

(51) Int. Cl.[7] ............................................. G06F 19/00
(52) U.S. Cl. ....................................... 700/121; 700/108
(58) Field of Search ........................ 700/99–101, 104, 700/108–110, 121; 705/7, 9

(56) References Cited

U.S. PATENT DOCUMENTS

| | | | |
|---|---|---|---|
| 5,526,293 A * | 6/1996 | Mozumder et al. ............ 716/19 |
| 5,751,580 A * | 5/1998 | Chi .............................. 700/101 |
| 6,303,395 B1 * | 10/2001 | Nulman ......................... 438/14 |
| 6,584,369 B2 * | 6/2003 | Patel et al. ................... 700/100 |
| 6,587,744 B1 * | 7/2003 | Stoddard et al. ............. 700/121 |
| 6,594,536 B1 * | 7/2003 | Lin et al. ....................... 700/99 |
| 2002/0193899 A1 * | 12/2002 | Shanmugasundram et al. .......................... 700/108 |

OTHER PUBLICATIONS

"Cycle time advantages of mini batch manufacturing integrated metrology in a 300 mm vertical furnace". Noben et al. Semiconductor Manufacturing Symposium, 2001 International. San Jose Ca. Oct. 8, 2001 - Oct. 10, 2001, pp. 411-414.*

* cited by examiner

*Primary Examiner*—Leo Picard
*Assistant Examiner*—Alexander Kosowski
(74) *Attorney, Agent, or Firm*—Williams, Morgan & Amerson, P.C.

(57) ABSTRACT

Methods of using dynamic metrology sampling techniques for identified lots, and a system for performing such methods are disclosed. In one illustrative embodiment, the method comprises identifying at least one wafer to be processed, identifying a process tool in which at least one wafer is to be processed, obtaining enhanced metrology data regarding a process operation to be performed in the identified process tool prior to processing the identified at least one wafer in the identified process tool, and positioning at least one wafer in the identified process tool and performing the process operation thereon.

24 Claims, 2 Drawing Sheets

DYNAMIC METROLOGY SAMPLING TECHNIQUES FOR IDENTIFIED LOTS, AND SYSTEM FOR PERFORMING SAME

BACKGROUND OF THE INVENTION

1. Field of the Invention

This invention relates generally to semiconductor fabrication technology, and, more particularly, to dynamic metrology sampling techniques for identified lots, and a system for performing same.

2. Description of the Related Art

There is a constant drive within the semiconductor industry to increase the operating speed of integrated circuit devices, e.g., microprocessors, memory devices, and the like. This drive is fueled by consumer demands for computers and electronic devices that operate at increasingly greater speeds. This demand for increased speed has resulted in a continual reduction in the size of semiconductor devices, e.g., transistors. That is, many components of a typical field effect transistor (FET), e.g., channel length, junction depths, gate insulation thickness, and the like, are reduced. For example, all other things being equal, the smaller the channel length of the transistor, the faster the transistor will operate. Thus, there is a constant drive to reduce the size, or scale, of the components of a typical transistor to increase the overall speed of the transistor, as well as integrated circuit devices incorporating such transistors.

By way of background, an illustrative field effect transistor 10, as shown in FIG. 1, may be formed above a surface 15 of a semiconducting substrate or wafer 11 comprised of doped-silicon. The substrate 11 may be doped with either N-type or P-type dopant materials. The transistor 10 may have a doped polycrystalline silicon (polysilicon) gate electrode 14 formed above a gate insulation layer 16. The gate electrode 14 and the gate insulation layer 16 may be separated from doped source/drain regions 22 of the transistor 10 by a dielectric sidewall spacer 20. The source/drain regions 22 for the transistor 10 may be formed by performing one or more ion implantation processes to introduce dopant atoms, e.g., arsenic or phosphorous for NMOS devices, boron for PMOS devices, into the substrate 11. Shallow trench isolation regions 18 may be provided to isolate the transistor 10 electrically from neighboring semiconductor devices, such as other transistors (not shown). Additionally, although not depicted in FIG. 1, a typical integrated circuit device is comprised of a plurality of conductive interconnections, such as conductive lines and conductive contacts or vias, positioned in multiple layers of insulating material formed above the substrate. These conductive interconnections allow electrical signals to propagate between the transistors formed above the substrate.

The gate electrode 14 has a critical dimension 12, i.e., the width of the gate electrode 14, that approximately corresponds to the channel length 13 of the device when the transistor 10 is operational. Of course, the critical dimension 12 of the gate electrode 14 is but one example of a feature that must be formed very accurately in modern semiconductor manufacturing operations. Other examples include, but are not limited to, conductive lines, openings in insulating layers to allow subsequent formation of a conductive interconnection, i.e., a conductive line or contact, therein, etc.

In the process of forming integrated circuit devices, millions of transistors, such as the illustrative transistor 10 depicted in FIG. 1, are formed above a semiconducting substrate. In general, semiconductor manufacturing operations involve, among other things, the formation of layers of various materials, e.g., polysilicon, insulating materials, etc., and the selective removal of portions of those layers by performing known photolithographic and etching techniques. These processes are continued until such time as the integrated circuit device is complete. Other processes are also involved, such as ion implantation and various heating processes.

During the course of fabricating such integrated circuit devices, a variety of features, e.g., gate electrodes, conductive lines, openings in layers of insulating material, etc., are formed to very precisely controlled dimensions. Such dimensions are sometimes referred to as the critical dimension (CD) of the feature. It is very important in modern semiconductor processing that features be formed as accurately as possible due to the reduced size of those features in such modern devices. For example, gate electrodes may now be patterned to a width 12 that is approximately 120 nm (1200 Å), and further reductions are planned in the future. As stated previously, the width 12 of the gate electrode 14 corresponds approximately to the channel length 13 of the transistor 10 when it is operational. Thus, even slight variations in the actual dimension of the feature as fabricated may adversely affect device performance. Thus, there is a great desire for methods that may be used to accurately, reliably and repeatedly form features to their desired critical dimension, i.e., to form the gate electrode 14 to its desired critical dimension 12.

In most cases, it is also desirable that the thickness of various process layers be very tightly controlled. Such layers may be formed by a variety of deposition processes, e.g., plasma enhanced chemical vapor deposition (PECVD), chemical vapor deposition (CVD), sputter deposition, etc. Thermal growth processes may also be employed in manufacturing process layers. As one specific example, the thickness of the gate insulation layer 16 for the transistor 10 must be very tightly controlled to insure that the completed device meets strict performance requirements. As another example, the thickness of a barrier metal layer formed in an opening in an insulating layer must be precisely controlled to insure substantial and conformal coverage of the interior surfaces of the opening. Moreover, the thickness of the barrier metal layer needs to be relatively uniform to insure that it performs its intended function and to insure that it does not create additional problems for processes that are to be subsequently performed, e.g., filling the opening with a conductive material such as copper.

Manufacturers of high performance integrated circuit products expend great effort in attempting to insure that the products meet the very stringent manufacturing tolerances. More particularly, a vast amount of metrology data is typically acquired at various points during the manufacture of the products. Typically, manufacturers often establish a metrology sampling protocol or pattern to acquire metrology data about the devices as they are being manufactured. For example, a typical sampling plan may involve collecting metrology data on every tenth lot of substrates that are processed. Within each of the sampled lots, a set number of substrates, e.g., four, may be subjected to metrology testing. Standard metrology sampling plans are also applied to each sampled wafer. For example, thickness measurements of a deposited layer of material may be taken at a preselected standard number of locations. The pattern of the metrology sites in such a standard sampling protocol are selected so as to attempt to obtain information reflective of the entire deposited layer.

Metrology data is also collected with respect to various aspects of photolithography processes performed in manufacturing semiconductor devices. A stepper exposure process typically involves exposing a layer of photoresist to a light source to establish a pattern in the layer of photoresist. Such stepper exposure processes are performed on a flash-by-flash basis as the substrate is moved, or stepped, relative to the light source. Each flash may expose an area, i.e., an exposure field, that covers a plurality of die, e.g., four die (a 2×2 exposure field). The number of exposure fields per substrate may vary depending on the size of the substrate, the number of die, and the size of the exposure field. For an illustrative substrate having 200–500 die, a stepper process using a 2×2 exposure field pattern (four die per exposure field), there will be between 50–125 exposure fields per substrate. However, a typical metrology sampling plan may involve obtaining metrology data from only one metrology site within each of nine exposure fields on the substrate.

Manufacturing integrated circuit products is a very complex undertaking that is due, at least in part, to the very small size of the various components and the complexity of the process used in forming such components. To that end, manufacturers typically try to develop new products and processing techniques in an effort to improve process yields and/or create better overall products. It is very often the case that any process or product variations are subjected to great scrutiny prior to the adoption or implementation of such new processes in an actual production environment. That is, such new or modified processes and/or products are subjected to many tests prior to allowing the new process/product to be used in making or incorporated into actual production devices. In some cases, such testing or qualification may be performed by performing the new process operation on a number of test wafers.

In the case of process and/or product modifications, the test wafers are typically run in the same process tool in an effort to reduce the influence of tool-to-tool variations with respect to the evaluation of the new process modification or new product change. Despite such extensive efforts, there continues to be a need for various methods that may improve the ability to qualify such new process operations and/or product changes.

In some cases, due to production requirements, there may be a need to process a lot of wafers (or several lots) in a process tool believed to produce superior results. For example, at the end of a particular business period, e.g., a calendar quarter, it may be the case that, due to a variety of reasons, there is a greater demand for high-performance integrated devices than previously planned, e.g., high-speed microprocessors, large capacity memory devices, etc. To that end, production managers may direct that one or more lots of wafers be processed in specific process tools believed to produce the best results in an effort to produce the desired number of high-performance integrated circuit devices. Despite such efforts, improvements need to be made in processing methodologies such that production yields may be increased.

The present invention is directed to various methods and systems that may solve, or at least reduce, some or all of the aforementioned problems.

SUMMARY OF THE INVENTION

The present invention is generally directed to various dynamic metrology sampling techniques for identified lots, and a system for performing same. In one illustrative embodiment, the method comprises identifying at least one wafer to be processed, identifying a process tool in which at least one wafer is to be processed, obtaining enhanced metrology data regarding a process operation to be performed in the identified process tool prior to processing the identified at least one wafer in the identified process tool, and positioning at least one wafer in the identified process tool and performing the process operation thereon.

In another illustrative embodiment, the method comprises identifying at least one lot of wafers to be processed, identifying a process tool in which the lot of wafers is to be processed, obtaining enhanced metrology data regarding a process operation to be performed in the identified process tool prior to processing the identified lot of wafers in the identified process tool, and positioning at least one wafer from the identified lot in the identified process tool and performing the process operation thereon.

In a further illustrative embodiment, the method comprises identifying at least one wafer to be processed, identifying a process tool in which the wafer is to be processed, in response to the identification of the wafer and the identification of the process tool, increasing a frequency at which metrology data regarding a process operation to be performed in the identified process tool is acquired prior to processing the identified wafer in the identified process tool, and positioning the wafer in the identified process tool and performing the process operation thereon.

In yet another illustrative embodiment, the method comprises identifying at least one lot of wafers to be processed, identifying a process tool in which the lot of wafers is to be processed, in response to the identification of the lot of wafers and the identification of the process tool, increasing an amount of metrology data acquired regarding a process operation to be performed in the identified process tool prior to processing the identified lot of wafers in the identified process tool, and positioning the wafer from the identified lot of wafers in the identified process tool and performing the process operation thereon.

BRIEF DESCRIPTION OF THE DRAWINGS

The invention may be understood by reference to the following description taken in conjunction with the accompanying drawings, in which like reference numerals identify like elements, and in which.

Figure 1:
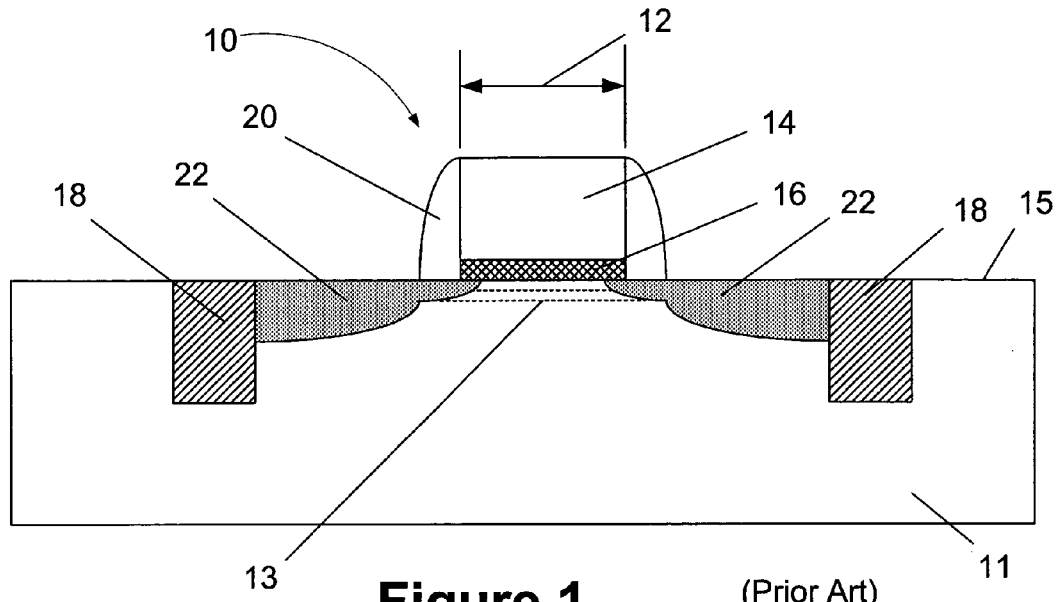
FIG. 1 is a cross-sectional view of an illustrative prior art transistor.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

In general, the present invention is directed to various dynamic metrology sampling techniques for identified lots, and a system for performing same. As will be readily apparent to those skilled in the art upon a complete reading of the present application, the present method is applicable to a variety of technologies, e.g., NMOS, PMOS, CMOS, etc., and it is readily applicable to a variety of devices, including, but not limited to, logic devices, memory devices, etc.

Figure 2:
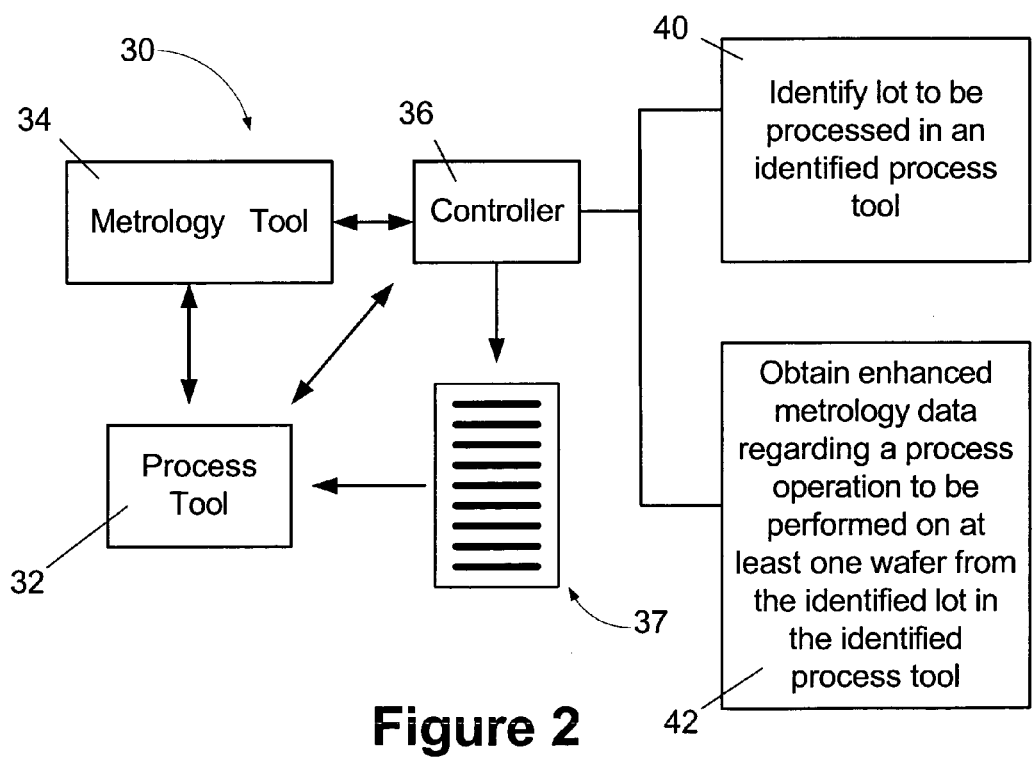
FIG. 2 depicts an illustrative embodiment of a system in accordance with one embodiment of the present invention.

FIG. 2 is a schematic depiction of an illustrative system 30 that may be employed with one or more aspects of the present invention. The illustrative system 30 is generally comprised of a process tool 32, a metrology tool 34 and a controller 36. Also depicted in FIG. 2 is a representative lot of wafers 37 that are to be subjected to a process operation performed in the process tool 32. As will be recognized by those skilled in the art after a complete reading of the present application, the process tool 32 may be any type of tool or chamber used in semiconductor manufacturing operations. For example, the process tool 32 may be a deposition tool, a photolithography track/stepper, an etch tool, a furnace, an ion implant tool, a rapid thermal anneal tool, a chemical mechanical polishing tool, wet etch tool or sink, a plasma stripper, etc. Although the present invention will be disclosed in the context whereby a lot of wafers 37 are processed in the process tool 32, the present invention is not so limited. Rather, as will be understood by those skilled in the art after a complete reading of the present application, the present invention may be employed in the context of when a single wafer is identified for processing in the process tool. The present invention may also be applicable to an entire batch of wafers in the case of batch processing tools like a furnace and most wet sinks.

As set forth in the background section of the application, situations may arise where a specifically identified lot of wafers 37 are to be processed in a specifically identified process tool 32. For example, in the context of testing a new or modified process operation, it may be desirable to run various test wafers in the same processing tool 32 in an effort to reduce the impact of tool-to-tool process variations. In that manner, the effectiveness of the new or modified processes may be more effectively evaluated. Typically, the identified process tool 32 would, in this case, be one expected to, based upon historical metrology (or observation), produce good results relative to one or more target parameters.

As another example, one or more specifically identified lots of wafers 37 may be processed in a specifically identified process tool 32 in an effort to meet various production requirements. For example, to meet production goals, it may be required to produce a number of high-performance integrated circuit products, e.g., memory devices, microprocessors, etc., in a relatively short period of time. To that end, one or more lots of wafers 37, so-called "hot lots" may be identified for prompt processing in one or more specifically identified process tools 32. The identified process tools 32 may be selected based upon a demonstrated historical ability to produce superior results. For example, the identified process tool 32 may be an etch tool that has a demonstrated ability to produce gate electrode structures of a desired critical dimension and/or profile. As another example, the process tool 32 may be a furnace that has a demonstrated ability to form very thin, high-quality gate insulation layers comprised of silicon dioxide. Such techniques are employed in an effort to insure that the wafers in the "hot lots" are processed in specifically identified process tools that are believed to provide superior results. Using this technique, it is believed that chances of producing integrated circuit products with the desired high-quality performance characteristics are improved. As yet another example, the process tool 32 may be a wet sink that exhibits better cleaning capabilities or an ion implant tool that appears to have the most consistent/predictable doping ability.

Typically, the identified process tools 32 are selected based upon metrology data collected by the metrology tool 34 over a relatively long period of time, e.g., over the period during which a relatively large number of lots of wafers are processed in the process tool 32. Moreover, such metrology data may be acquired irrespective of the maintenance level of the process tool 32. That is, in some cases, the metrology data that is acquired regarding the results produced by the processing operation performed in the process tool 32 may be acquired right after maintenance procedures have been performed, just prior to maintenance procedures being performed, and/or any time in between.

In general, metrology data regarding a process operation performed in the process tool 32 will be acquired. The metrology data will be directed to the results of the process performed in the process tool 32. For example, where the process tool 32 is a deposition tool, the metrology data may relate to the thickness of the layer of material formed in the process tool at one or more locations across the surface of the process layer. As another example, if the process tool is an etch tool, the metrology data may relate to the critical dimension and/or profile of the etched features. As yet another example, the process tool 32 may be a chemical mechanical planarization (CMP) tool and the metrology data may relate to the surface profile of a layer subjected to polishing operations in the CMP tool 32, e.g., center-fast, edge-fast, etc. As another example, the process tool 32 may be a wet sink and the metrology data may relate to particle reduction after the cleaning operation.

Typically, the metrology data collected with respect to the processing operations performed in the process tool 32 will be acquired as part of a standard metrology sampling program established for the particular process or product. The data may be collected on a real-time basis, i.e., as the process operation is being performed, or after the process has been completed. For example, a standard metrology sampling plan may involve measuring at least some characteristics of a selected number of wafers, e.g., 3–5, from a selected number of lots processed in the process tool 32, e.g., one of every ten lots processed in the process tool 32. Further, if the process tool 32 is, for example, a deposition tool, the thickness of the process layer formed in the process tool may be measured at a preset number of metrology sites, e.g., 49 arranged in a pattern comprised of a plurality of concentric circles of ever-increasing diameter. As another example, if the process tool 32 is an etch tool, a standard metrology sampling plan may involve measuring the critical dimension and/or profile of a number of features, e.g., 50–100, from various locations across the wafer. If the process tool is a stepper exposure tool, a standard metrology sampling plan may involve obtaining metrology data at one metrology site within each of nine exposure fields located across the surface of a wafer.

The processing of the "hot lots" and/or the lots containing various test wafers to qualify or evaluate new processes and product modifications is very critical. With respect to the processing of such lots based upon production needs, it is imperative that the processing yields be as high as possible so that the production requirements are met quickly and with a minimum of wasted product and effort. With respect to the qualification of new process recipes and product changes, it is also important that process variations be kept to an absolute minimum so as to enable the effective evaluation of the new processes and products.

In identifying the process tool 32 in which such "hot lots" or test wafers will be processed, resort may be made to metrology data that has been collected as part of standard metrology sampling plans in which data is acquired over a relatively long period of time. Unfortunately, such metrology data may not be indicative of the abilities of the process tool 32 just prior to performing a process operation on the identified lot of wafers 37, e.g., on a "hot lot" or one or more test wafers. That is, in some cases, the historical metrology data may not accurately reflect the capabilities of the process tool at a point in time when the hot lots or test wafers are processed.

In accordance with one aspect of the present invention, when an identified lot of wafers is selected for processing in an identified process tool 32, enhanced metrology data is obtained regarding the process operation to be performed in the process tool 32. That is, as indicated at block 40 of FIG. 2, the invention involves identifying a lot of wafers 37 to be processed in an identified process tool 32, and obtaining enhanced metrology data regarding a process operation to be performed in the identified process tool 32, as indicated at block 42. In some cases, the controller 36 may be involved in identifying the lot of wafers 37 to be processed and the process tool 32 in which the lot of wafers 37 is to be processed. The controller 36 may also be involved in obtaining the enhanced metrology data regarding the process operation to be performed in the process tool 32. In other cases, such identifications and metrology data may simply be provided to the controller 36. In one illustrative embodiment, the controller 36 identifies the lot of wafers 37 and the process tool 32 in which the identified lot is to be processed, and further directs the metrology tool 34 to obtain enhanced metrology data regarding the process operation performed in the process tool 32.

The enhanced metrology data regarding the process operations to be performed in the process tool 32 may vary, in some cases, in at least one aspect with respect to a standard metrology sampling plan performed with respect to the processing operation performed in the process tool 32. For example, the enhanced metrology data may involve acquiring an increased amount of data regarding the processing operation or it may involve acquiring a different type of metrology data using the same or different types of metrology tools as used in acquiring the metrology data during the standard metrology sampling plan. As more specific examples, obtaining the enhanced metrology data may involve acquiring metrology data more frequently from various lots, e.g., obtaining metrology data for one of every two processed lots as compared to one of every ten processed lots, performing more metrology measurements, e.g., measuring the thickness of a layer of material at 400 locations versus 9 locations in accordance with the standard metrology sampling plan. A different type of metrology data may also be acquired in obtaining the enhanced metrology sampling plan. For example, with respect to etched features, the standard metrology sampling plan may involve only obtaining data relating to the critical dimension of the etched features. In obtaining the enhanced metrology data, the cross-sectional profile of the etched features may be obtained in addition to, or in lieu of, the critical dimension metrology data. The pattern of metrology sites may also be varied in acquiring the enhanced metrology data as compared to a pattern employed in acquiring metrology data relating to the process operation performed in the process tool 32 in accordance with the standard metrology sampling plan. In general, the enhanced metrology data is the result of an enhanced metrology sampling plan that varies in at least some aspect relative to a metrology sampling plan previously employed. Such variations may include the number, location and/or pattern of metrology sites, the type of metrology data acquired, and the metrology sampling frequency.

The enhanced metrology data is acquired so that a better evaluation may be made as to whether the identified process tool 32 is capable of performing the process operation at the desired performance level on the identified lot of wafers, e.g., "hot lots," test wafers. That is, the present invention involves analyzing the enhanced metrology data to determine if the identified process tool 32 is acceptable for processing the identified lot (or wafer) in the identified process tool 32. The enhanced metrology data is typically acquired just prior to processing the identified lot of wafers 37 in the identified process tool 32. This enhanced metrology data reflects the capabilities of the processing tool 32 just prior to performing process operations on the hot lots or test wafers. Simply put, given the importance of accurately processing such "hot lots" and/or test wafers, the present invention involves obtaining enhanced metrology data to make the determination as to the acceptability of the identified process tool 32 based upon enhanced metrology data that, in some cases, is a larger collection of relevant metrology data that has been more recently collected.

In determining the acceptability of the identified process tool 32 for processing the identified lot 37, the controller 36 (or other processing entity) may evaluate the enhanced metrology data and/or previously collected metrology data. For example, the controller 36 may initially analyze the enhanced metrology data to determine the acceptability of the identified process tool 32. The controller 36 may then, in some cases, compare the enhanced metrology data to the metrology data acquired in accordance with the standard metrology sampling plan. In some cases, all of the collected data may be analyzed with an appropriate weighting factor being applied to the enhanced metrology data. Various control routines and logic that may be employed in evaluating the collected metrology data are well known to those skilled in the art and, thus, will not be discussed in any greater detail.

The metrology tool 34 may be any type of metrology tool capable of collecting any type of metrology data. For example, the metrology data described herein may relate to critical dimensions of a feature, a thickness of a process layer, a temperature or pressure of the process operation, a planarity of a process layer, a depth of an implant region, the shape or profile of a patterned feature, electrical characteristics (e.g., resistivity, capacitance), optical characteristics (n and k), film stress, etc. Moreover, it should be understood that the single metrology tool depicted in FIG. 2 is representative in nature. That is, multiple metrology tools of different types may be employed in the context of the present invention to obtain any of the types of metrology data described herein. For example, the metrology tool 34 may be an ellipsometer, a scanning electron microscope, a profilometer, a scatterometry tool, an overlay metrology tool, a defect inspection tool, a metallic ion contamination tool, a four-point probe for measuring a metal film sheet resistance, etc.

In the illustrated embodiments, the controller 36 is a computer programmed with software to implement the functions described herein. Moreover, the functions described for the controller 36 may be performed by one or more controllers spread through the system. For example, the controller 36 may be a fab level controller that is used to control processing operations throughout all or a portion of a semiconductor manufacturing facility. Alternatively, the controller 36 may be a lower level computer that controls only portions or cells of the manufacturing facility. Moreover, the controller 36 may be a stand-alone device, or it may reside on the metrology tool 34 or the process tool 32. However, as will be appreciated by those of ordinary skill in the art, a hardware controller (not shown) designed to implement the particular functions may also be used.

Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be understood, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the actions and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

An exemplary software system capable of being adapted to perform the functions of the controller 36, as described, is the Catalyst system offered by KLA Tencor, Inc. The Catalyst system uses Semiconductor Equipment and Materials International (SEMI) Computer Integrated Manufacturing (CIM) Framework compliant system technologies, and is based on the Advanced Process Control (APC) Framework. CIM (SEMI E81-0699—Provisional Specification for CIM Framework Domain Architecture) and APC (SEMI E93-0999—Provisional Specification for CIM Framework Advanced Process Control Component) specifications are publicly available from SEMI.

Figure 3:
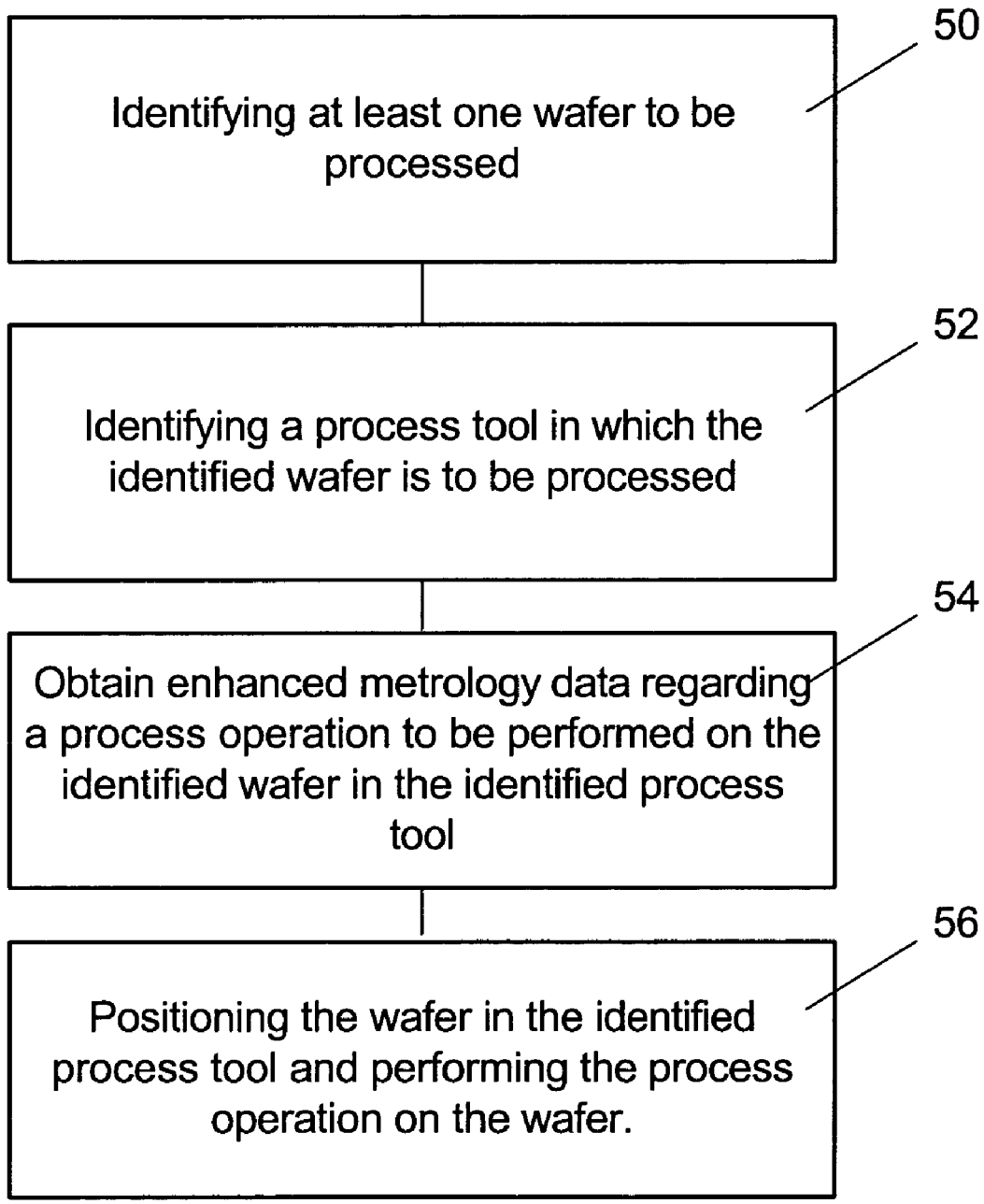
FIG. 3 is a depiction of one illustrative embodiment of the present invention in flowchart form.

The present invention is generally directed to various dynamic metrology sampling techniques for identified lots, and a system for performing same. In one illustrative embodiment, as depicted in FIG. 3, the method comprises identifying at least one wafer to be processed, as indicated in block 50, and identifying a process tool in which the wafer is to be processed, as set forth in block 52. The method further comprises obtaining enhanced metrology data regarding a process operation to be performed in the identified process tool prior to processing the identified wafer in the identified process tool, as recited at block 54, and positioning the identified wafer in the identified process tool and performing the process operation thereon, as indicated at block 56.

In another illustrative embodiment, the method comprises identifying at least one lot of wafers to be processed, identifying a process tool in which at least one lot of wafers is to be processed, obtaining enhanced metrology data regarding a process operation to be performed in the identified process tool prior to processing the identified lot of wafers in the identified process tool, and positioning at least one wafer from the identified lot in the identified process tool and performing the process operation thereon.

In a further illustrative embodiment, the method comprises identifying at least one wafer to be processed, identifying a process tool in which the wafer is to be processed, in response to the identification of the wafer and the identification of the process tool, increasing a frequency at which metrology data regarding a process operation to be performed in the identified process tool is acquired prior to processing the identified wafer in the identified process tool, and positioning the wafer in the identified process tool and performing the process operation thereon.

In yet another illustrative embodiment, the method comprises identifying at least one lot of wafers to be processed, identifying a process tool in which the lot of wafers is to be processed, in response to the identification of the lot of wafers and the identification of the process tool, increasing an amount of metrology data acquired regarding a process operation to be performed in the identified process tool prior to processing the identified lot of wafers in the identified process tool, and positioning the wafer from the identified lot of wafers in the identified process tool and performing the process operation thereon.

Through use of the present invention, better process control may be achieved in modern integrated circuit manufacturing facilities. Additionally, the present invention may enable more precise formation of various features of integrated circuit devices, thereby improving device performance and increasing production yields. Moreover, the present invention may allow more effective evaluation of production techniques and qualification of new processes or product modifications.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   identifying at least one wafer to be processed;
   identifying a process tool in which said at least one wafer is to be processed;
   obtaining enhanced metrology data regarding a process operation to be performed in said identified process tool prior to processing said identified at least one wafer in said identified process tool;
   analyzing at least said enhanced metrology data to determine if said process tool is acceptable for processing said identified at least one wafer; and
   if said process tool is determined to be acceptable, positioning said at least one wafer in said identified process tool and performing said process operation thereon.

2. The method of claim 1, wherein said identified at least one wafer is part of a lot of wafers identified for processing in said identified process tool.

3. The method of claim 1, wherein said identified at least one wafer is a wafer wherein production integrated circuit devices are formed thereon.

4. The method of claim 1, wherein said identified at least one wafer is a test wafer.

5. The method of claim 1, wherein said identified process tool is at least one of a deposition tool, an etch tool, a furnace, an ion implant tool, a chemical mechanical polishing tool and a photolithography tool.

6. The method of claim 1, wherein said step of obtaining enhanced metrology data regarding said process operation comprises obtaining a greater amount of metrology data for said process operation relative to an amount of metrology data obtained for said process operation in accordance with a previously established metrology sampling plan.

7. The method of claim 1, wherein said step of obtaining enhanced metrology data regarding said process operation comprises obtaining a different type of metrology data for said process operation relative to a type of metrology data obtained for said process operation in accordance with a previously established metrology sampling plan.

8. The method of claim 1, wherein said step of obtaining enhanced metrology data regarding said process operation comprises increasing a frequency at which metrology data for said process operation is acquired relative to a frequency at which metrology data for said process operation is acquired in accordance with a previously established metrology sampling plan.

9. A method, comprising:
   identifying at least one lot of wafers to be processed;
   identifying a process tool in which said at least one lot of wafers is to be processed;
   obtaining enhanced metrology data regarding a process operation to be performed in said identified process tool prior to processing said identified at least one lot of wafers in said identified process tool;
   analyzing at least said enhanced metrology data to determine if said process tool is acceptable for processing said identified at least one wafer; and
   if said process tool is determined to be acceptable, positioning said at least one wafer from said identified lot of wafers in said identified process tool and performing said process operation thereon.

10. The method of claim 9, wherein said identified at least one lot of wafers is comprised of a plurality of wafers having production integrated circuit devices formed thereon.

11. The method of claim 9, wherein said identified at least one lot of wafers is comprised of a plurality of test wafers.

12. The method of claim 9, wherein said identified process tool is at least one of a deposition tool, an etch tool, a furnace, an ion implant tool, a chemical mechanical polishing tool and a photolithography tool.

13. The method of claim 9, wherein said step of obtaining enhanced metrology data regarding said process operation comprises obtaining a greater amount of metrology data for said process operation relative to an amount of metrology data obtained for said process operation in accordance with a previously established metrology sampling plan.

14. The method of claim 9, wherein said step of obtaining enhanced metrology data regarding said process operation comprises obtaining a different type of metrology data for said process operation relative to a type of metrology data obtained for said process operation in accordance with a previously established metrology sampling plan.

15. The method of claim 9, wherein said step of obtaining enhanced metrology data regarding said process operation comprises increasing a frequency at which metrology data for said process operation is acquired relative to a frequency at which metrology data for said process operation is acquired in accordance with a previously established metrology sampling plan.

16. A method, comprising:
    identifying at least one lot of wafers to be processed;
    identifying a process tool in which said at least one lot of wafers is to be processed;
    in response to the identification of said at least one lot of wafers and the identification of said process tool, increasing a frequency at which metrology data regarding a process operation to be performed in said identified process tool is acquired prior to processing said identified at least one lot of wafers in said identified process tool;
    analyzing at least said metrology data acquired as a result of the increased frequency at which metrology data is acquired to determine if said process tool is acceptable for processing said at least one lot of wafers; and
    if said process tool is determined to be acceptable, positioning at least one wafer from said identified lot in said identified process tool and performing said process operation thereon.

17. The method of claim 16, wherein said identified at least one lot of wafers is comprised of a plurality of wafers wherein production integrated circuit devices are formed thereon.

18. The method of claim 16, wherein said identified at least one lot of wafers is comprised of a plurality of test wafers.

19. The method of claim 16, wherein said identified process tool is at least one of a deposition tool, an etch tool, a furnace, an ion implant tool, a chemical mechanical polishing tool and a photolithography tool.

20. The method of claim 16, wherein said step of increasing the frequency at which metrology data is acquired comprises obtaining a greater amount of metrology data for said process operation relative to an amount of metrology data obtained for said process operation in accordance with a previously established metrology sampling plan.

21. A method, comprising:
    identifying at least one lot of wafers to be processed;
    identifying a process tool in which said at least one lot of wafers is to be processed;
    in response to the identification of said at least one lot of wafers and the identification of said process tool, increasing an amount of metrology data acquired regarding a process operation to be performed in said identified process tool prior to processing said identified at least one lot of wafers in said identified process tool;
    analyzing at least said increased amount of metrology data acquired to determine if said process tool is acceptable for processing said identified at least one wafer; and
    if said process tool is determined to be acceptable, positioning said at least one wafer from said identified lot of wafers in said identified process tool and performing said process operation thereon.

22. The method of claim 21, wherein said identified at least one lot of wafers is comprised of a plurality of wafers having production integrated circuit devices formed thereon.

23. The method of claim 21, wherein said identified at least one lot of wafers is comprised of a plurality of test wafers.

24. The method of claim 21, wherein said identified process tool is at least one of a deposition tool, an etch tool, a furnace, an ion implant tool, a chemical mechanical polishing tool and a photolithography tool.

* * * * *